(12) United States Patent
Khon

(10) Patent No.: US 10,447,314 B2
(45) Date of Patent: Oct. 15, 2019

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventor: Luong Khon, Ho Chi Minh (VN)

(73) Assignee: PHISON ELECTRONICS CORP., Miaoli (TW)

( * ) Notice: Subject to any disclaimer, the term of this patent is extended or adjusted under 35 U.S.C. 154(b) by 67 days.

(21) Appl. No.: 15/805,152

(22) Filed: Nov. 7, 2017

(65) Prior Publication Data

US 2019/0074852 A1 Mar. 7, 2019

(30) Foreign Application Priority Data

Sep. 7, 2017 (TW) .............................. 106130588 A

(51) Int. Cl.

| | |
|---|---|
| *H03M 13/37* | (2006.01) |
| *H04N 19/423* | (2014.01) |
| *H04L 1/00* | (2006.01) |
| *G06F 12/02* | (2006.01) |
| *H04N 19/44* | (2014.01) |
| *G11C 11/406* | (2006.01) |
| *G11C 11/4093* | (2006.01) |
| *G11C 16/00* | (2006.01) |
| *G11C 29/52* | (2006.01) |
| *G11C 29/00* | (2006.01) |
| *G11C 29/04* | (2006.01) |
| *G11C 7/10* | (2006.01) |

(52) U.S. Cl.
CPC .... *H03M 13/3738* (2013.01); *G06F 12/0246* (2013.01); *G11C 11/4093* (2013.01); *G11C 11/40607* (2013.01); *G11C 16/00* (2013.01); *H04L 1/0046* (2013.01); *H04N 19/423* (2014.11); *H04N 19/44* (2014.11); *G11C 7/1006* (2013.01); *G11C 29/52* (2013.01); *G11C 29/70* (2013.01); *G11C 2029/0409* (2013.01); *G11C 2029/0411* (2013.01)

(58) Field of Classification Search
CPC . H03M 13/3738; H04N 19/423; H04N 19/44; H04L 1/0046; G11C 11/4093; G11C 29/52; G11C 11/40607; G11C 7/1006; G11C 7/00; G06F 12/0246; G06F 2212/7201; G06F 3/064; G06F 3/0656; G06F 3/0688; G06F 2212/7203; G06F 3/0689

See application file for complete search history.

(56) References Cited

U.S. PATENT DOCUMENTS 9,639,419 B2 * 5/2017 Lin ...................... G06F 11/1048
9,772,940 B2 * 9/2017 Choi .................... G06F 12/0246
(Continued)

*Primary Examiner* — Phung M Chung
(74) *Attorney, Agent, or Firm* — JCIPRNET

(57) ABSTRACT

A decoding method which includes: storing first data into a buffer memory which includes a first buffer region and a second buffer region; copying decoding data in the second buffer region to the first buffer region; performing a first type decoding operation for the first data based on the copied decoding data in the first buffer region, where the copied decoding data is different from original decoding data corresponding to the first data; and outputting decoded data if the first type decoding operation is successful.

30 Claims, 9 Drawing Sheets

(56) References Cited

U.S. PATENT DOCUMENTS

| | | | | |
|---|---|---|---|---|
| 10,126,953 | B2* | 11/2018 | Lee | G06F 3/061 |
| 10,191,806 | B2* | 1/2019 | Lin | G06F 3/0611 |
| 10,318,379 | B2* | 6/2019 | Khon | G06F 3/061 |
| 2017/0255511 | A1* | 9/2017 | Lin | G06F 3/0619 |
| 2019/0073266 | A1* | 3/2019 | Khon | G06F 11/1076 |

* cited by examiner

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106130588, filed on Sep. 7, 2017. The entirety of the above-mentioned patent application is hereby incorporated by reference herein and made a part of this specification.

BACKGROUND

Technical Field

The invention relates to a decoding method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In general, for ensuring the correctness of data, the data is encoded and then stored into the rewritable non-volatile memory module. When the data is being read, the data is decoded to correct errors therein. If all the errors in the data are corrected, the corrected data is transmitted to a host system. However, with the progress in encoding/decoding technology, a data amount of the data to be temporarily stored during encoding/decoding may be greater than a capacity of a buffer memory. Therefore, it is usually required to repeatedly read specific data from the rewritable non-volatile memory module during encoding/decoding, such that the rewritable nonvolatile memory module can suffer additional wear and the encoding/decoding speed may be lowered. In particular, the above situation is more pronounced in an iteration decoding operation.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

An exemplary embodiment of the invention provides a decoding method, a memory storage device and a memory control circuit unit, which are capable of improving a decoding efficiency with limited capacity of a buffer memory.

An exemplary embodiment of the invention provides a decoding method for a rewritable non-volatile memory module. The rewritable non-volatile memory module includes a plurality of physical units. The decoding method includes: temporarily storing first data into a buffer memory, wherein the buffer memory includes a first buffer region and a second buffer region; copying decoding data in the second buffer region to the first buffer region; performing a first type decoding operation for the first data based on the copied decoding data in the first buffer region, wherein the copied decoding data is different from original decoding data corresponding to the first data; and outputting decoded data if the first type decoding operation is successful.

Another exemplary embodiment of the invention provides a memory storage device, which includes a connection interface unit, a rewritable non-volatile memory module and a memory control circuit unit. The connection interface unit is configured to couple to a host system. The rewritable non-volatile memory module includes a plurality of physical units. The memory control circuit unit is coupled to the connection interface unit and the rewritable non-volatile memory module. The memory control circuit unit is configured to temporarily store first data into a buffer memory. The buffer memory includes a first buffer region and a second buffer region. The memory control circuit unit is further configured to copy decoding data of the second buffer region to the first buffer region. The memory control circuit unit is further configured to perform a first type decoding operation for the first data based on the copied decoding data in the first buffer region. The copied decoding data is different from original decoding data corresponding to the first data. The memory control circuit unit is further configured to output decoded data if the first type decoding operation is successful.

Another exemplary embodiment of the invention provides a memory control circuit unit, which is configured to control a rewritable non-volatile memory module. The rewritable non-volatile memory module includes a plurality of physical units. The memory control circuit unit includes a host interface, a memory interface, a buffer memory, an error checking and correcting circuit, and a memory management circuit. The host interface is configured to couple to a host system. The memory interface is configured to couple to the rewritable non-volatile memory module. The memory management circuit is coupled to the host interface, the memory interface, the buffer memory and the error checking and correcting circuit. The memory management circuit is configured to temporarily store first data into a buffer memory. The buffer memory includes a first buffer region and a second buffer region. The memory management circuit is further configured to copy decoding data in the second buffer region to the first buffer region. The error checking and correcting circuit is configured to perform a first type decoding operation for the first data based on the copied decoding data in the first buffer region. The copied decoding data is different from original decoding data corresponding to the first data. The memory management circuit is further configured to output decoded data if the first type decoding operation is successful.

Based on the above, the invention is capable of keeping the decoding data dynamically generated during the decoding process in the buffer memory. Later, when the first data is to be decoded, instead of obtaining the decoding data by repeatedly reading the related data from the rewritable non-volatile memory module and repeating calculation, the decoding data may be used in real time. As a result, the decoding efficiency may be improved with limited capacity of the buffer memory.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
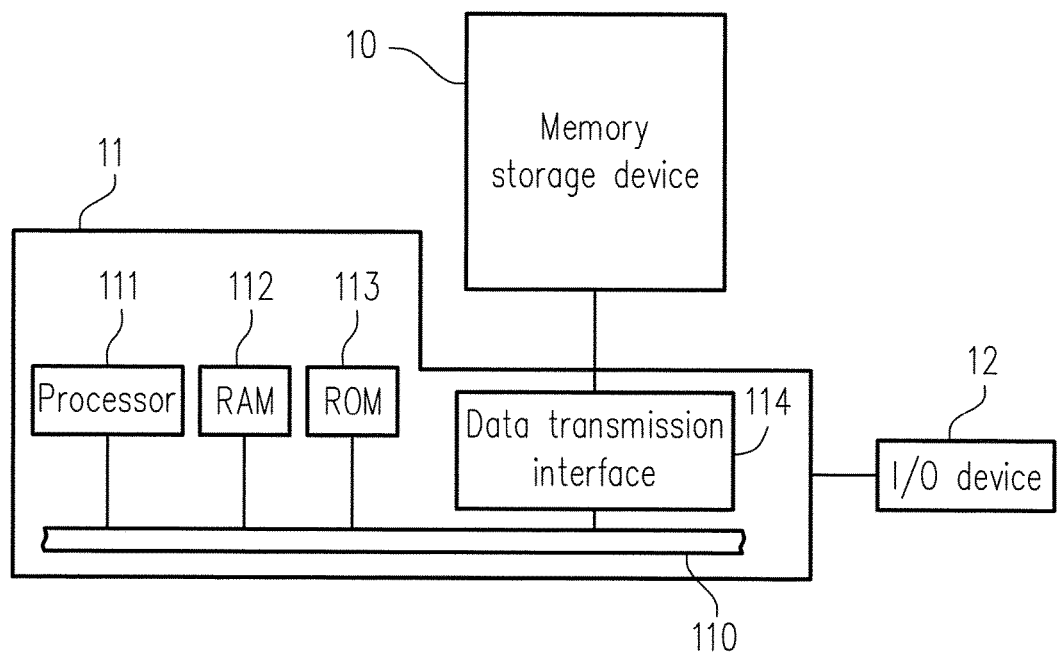
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
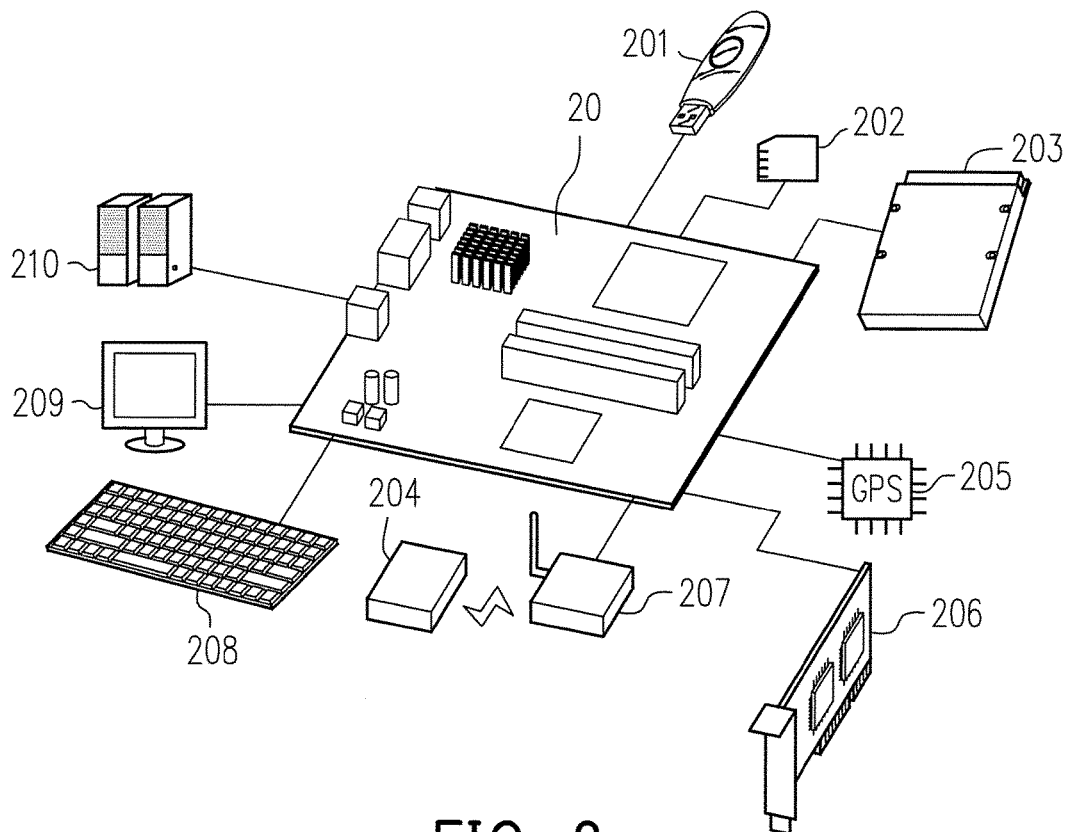
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
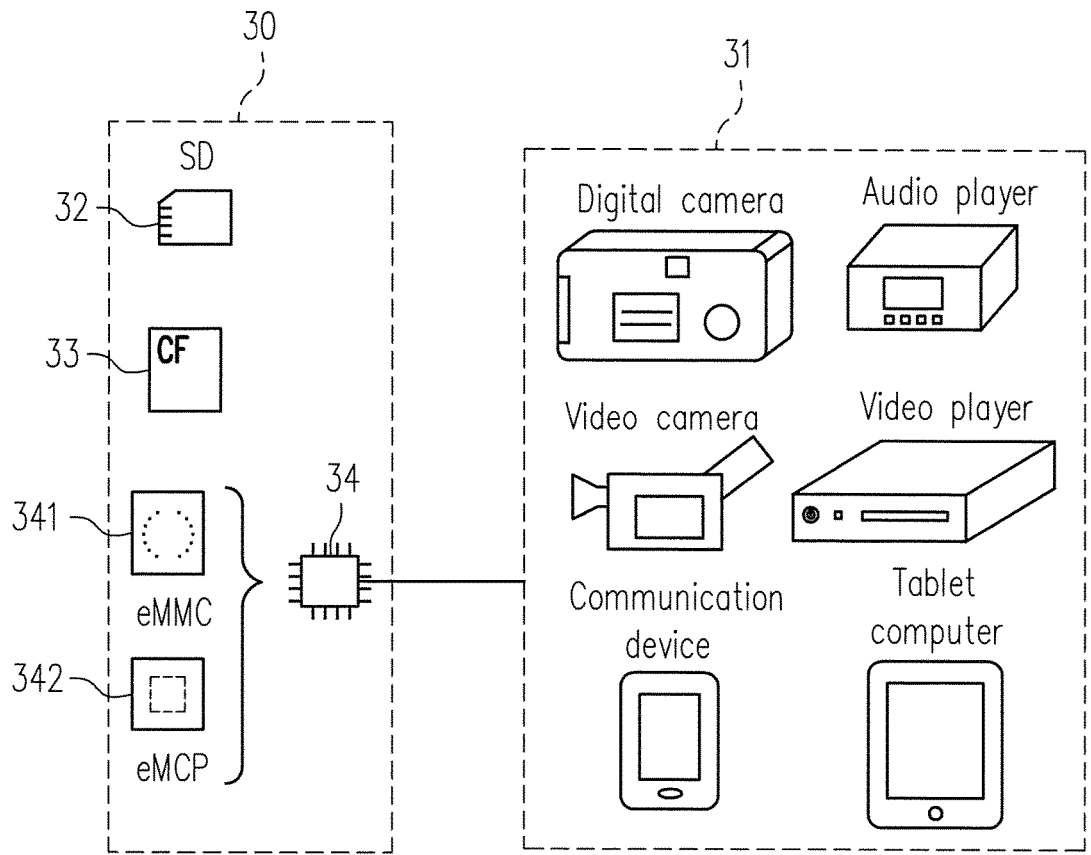
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
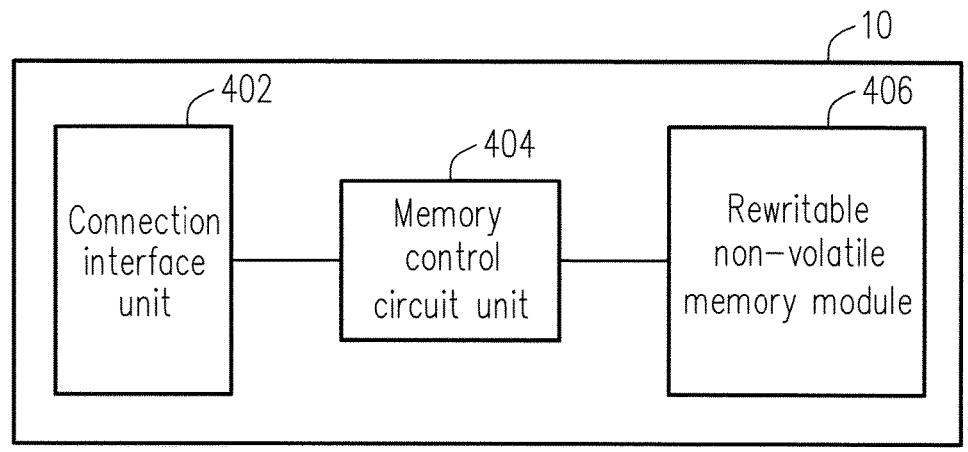
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

The connection interface unit 402 is configured to couple to the memory storage device 10 to the host system 11. In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 may be distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". By changing the threshold voltage, each of the memory cells in the rewritable non-volatile memory module 406 can have a plurality of storage states. The storage state to which the memory cell belongs may be determined by applying a read voltage to the memory cell, so as to obtain the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store two or more bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. In general, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., management data such as an error correcting code, etc.). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
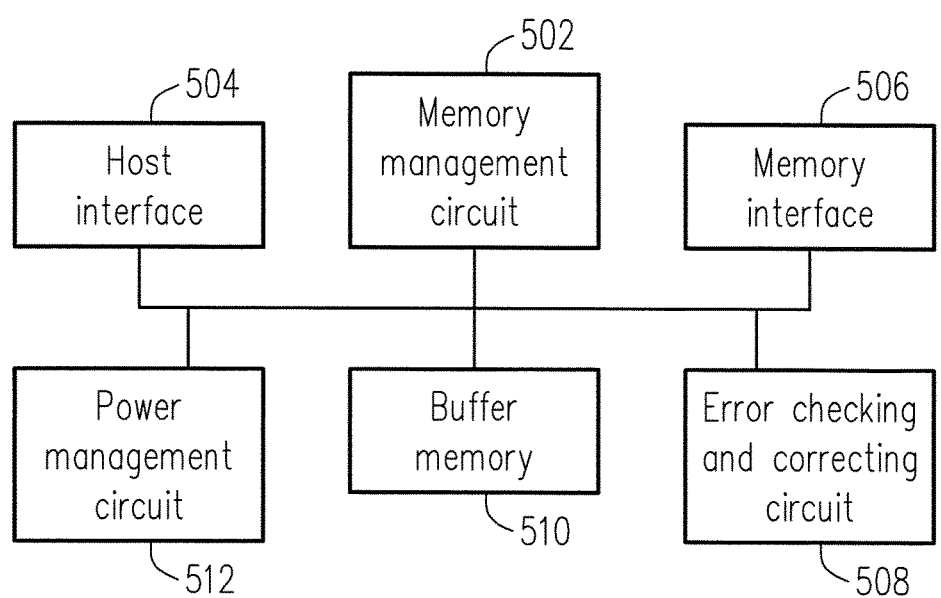
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504, a memory interface 506, an error checking and correcting circuit 508 and a buffer memory 510.

The memory management circuit 502 is configured to control overall operations of the memory control circuit unit 404. Specifically, the memory management circuit 502 has a plurality of control commands. When the memory storage device 10 operates, the control commands are executed to perform various operations such as data writing, data reading and data erasing. Hereinafter, operations of the memory management circuit 502 are described as equivalent to operations of the memory control circuit unit 404.

In the present exemplary embodiment, the control commands of the memory management circuit 502 are implemented in a firmware form. For instance, the memory management circuit 502 has a microprocessor unit (not illustrated) and a read-only memory (not illustrated), and the control commands are burnt into the read-only memory. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, which are configured to instruct the rewritable non-volatile memory module 406 to perform the corresponding operations, such as writing, reading and erasing. In an exemplary embodiment, the memory management circuit 502 may further give command sequence of other types for instructing the rewritable non-volatile memory module 406 to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. Nevertheless, it should be understood that the invention is not limited to the above. The host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends the corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection operation). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

The buffer memory 510 is coupled to the memory management circuit 502 and configured to temporarily store data and commands from the host system 11 or data from the rewritable non-volatile memory module 406. In an exemplary embodiment, the memory control circuit unit 404 further includes a power management circuit 512. The power management unit 512 is coupled to the memory management circuit 502 and configured to control power of the memory storage device 10.

Figure 6:
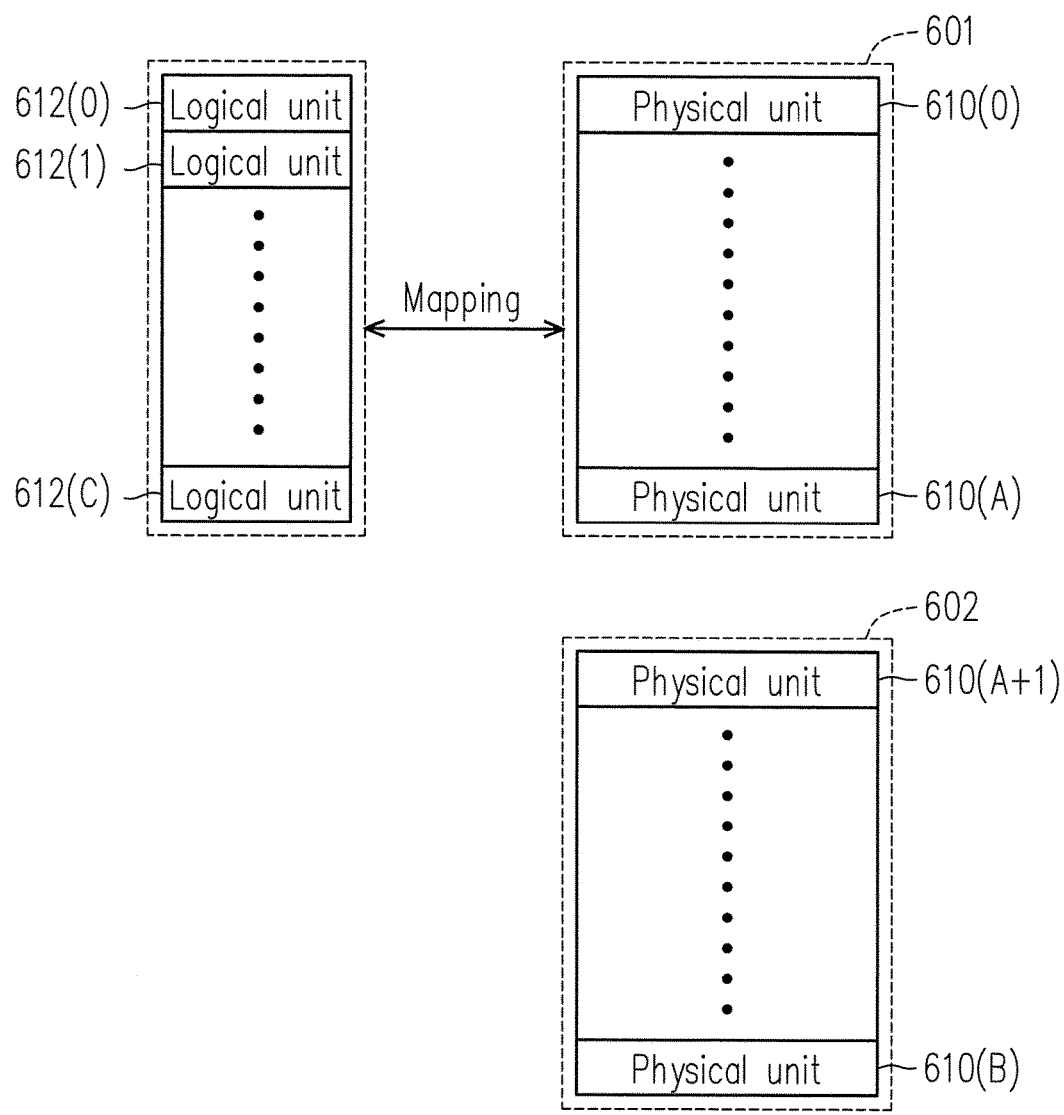
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention.

Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from one specific physical unit includes too many errors and these errors cannot be corrected, the specific physical unit may be treated as a damaged physical unit. It is noted that, if there are no available physical erasing units in the replacement area 602, the memory management circuit 502 may declare the memory storage device 10 as in a write protect state so data can no longer be written thereto.

In the present exemplary embodiment, each physical unit refers to one physical programming unit. However, in another exemplary embodiment, one physical unit may also refer to one physical address, one physical erasing unit, or a composition of a plurality of continuous or discontinuous physical addresses. The memory management circuit 502 assigns logical units 612(0) to 612(C) for mapping to the physical units 610(0) to 610(A) in the storage area 601. In the present exemplary embodiment, each logical unit refers to one logical address. However, in another exemplary embodiment, each logical unit may also refer to one logical programming unit, one logical erasing unit or a composition of a plurality of continuous or discontinuous logical addresses. In addition, each of the logical units 612(0) to 612(C) may also be mapped to one or more physical units.

The memory management circuit 502 records a mapping relation (a.k.a. a logical-physical address mapping relation) between the logical units and the physical units into at least one logical-physical address mapping table. When the host system 11 intends to read the data from the memory storage device 10 or write the data into the memory storage device 10, the memory management circuit 502 can perform a data accessing operation on the memory storage device 10 according to the logical-physical address mapping table.

It is noted that in the following description, some terms may be replaced with corresponding abbreviations for ease of reading (see Table 1).

TABLE 1

| rewritable non-volatile memory module | RNVM module |
| physical unit | PU |
| memory management circuit | MMC |
| error checking and correcting circuit | ECCC |

In the present exemplary embodiment, a basic unit of an encoding operation performed by the ECCC 508 is one frame (a.k.a. a decoding frame). One frame includes a plurality of data bits. In this exemplary embodiment, one frame includes 256 bits. However, in another exemplary embodiment, one frame may also include more (e.g., 4K bytes) or less bits.

In the present exemplary embodiment, the ECCC 508 can perform a single-frame encoding and decoding for data stored in the same PU and can also perform a multi-frame encoding and decoding for data stored in multiple PUs. Each of the single-frame encoding and the multi-frame encoding may adopt encoding algorithms including at least one of a LDPC (low density parity check) code, a BCH code, a convolutional code or a turbo code. Alternatively, in another exemplary embodiment, the multi-frame encoding may also adopt a RS codes (Reed-solomon codes) algorithm or a XOR (exclusive or) calculation. Further, in another exemplary embodiment, other encoding algorithms not mentioned above may also be adopted, which are omitted herein. According to the adopted encoding algorithm, the ECCC 508 can encode the data to be protected, so as to generate the corresponding ECC and/or the EDC. For clear description, the ECC and/or the EDC generated through encoding are collectively referred to as decoding data (i.e., data for decoding). In an exemplary embodiment, the decoding data generating by encoding is also known as parity data.

Figure 7:
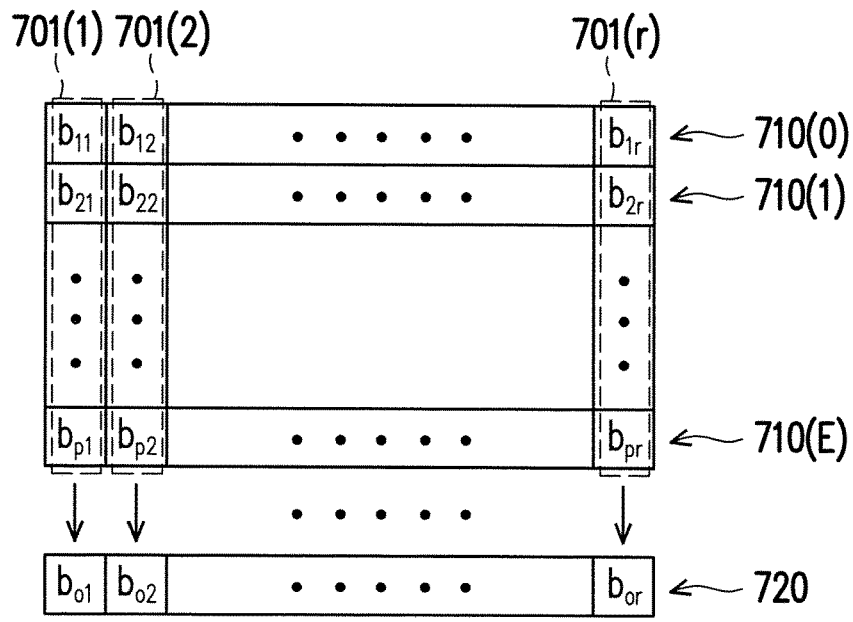
FIG. 7 is a schematic diagram illustrating a multi-frame encoding according to an exemplary embodiment of the invention.

FIG. 7 is a schematic diagram illustrating a multi-frame encoding according to an exemplary embodiment of the invention.

Referring to FIG. 7, decoding data 720 correspondingly generated by encoding the data stored in PUs 710(0) to 710(E) is taken as an example. At least a part of data stored by each of the PUs 710(0) to 710(E) may be regarded as one frame, respectively. In the multi-frame encoding, the data in the PUs 710(0) to 710(E) are encoded based on the positions of each bit (or bytes). For example, bits $b_{11}$, $b_{21}$, ..., $b_{p1}$ at a position 701(1) are encoded as a bit $b_{o1}$ in the decoding data 720, and bits $b_{12}$, $b_{22}$, ..., $b_{p2}$ at a position 701(2) are encoded as a bit $b_{o2}$ in the decoding data 720; and by analogy, bits $b_{1r}$, $b_{2r}$, ..., $b_{pr}$ at a position 701(r) are encoded as a bit $b_{or}$ in the decoding data 720.

In an exemplary embodiment, each of the PUs 710(0) to 710(E) is also known as a first PU, and a PU for storing the decoding data 720 is known as a second PU. The numbers of the first PUs and the second PUs may both be more or less. In an exemplary embodiment, because the decoding data 720 is generated by encoding specific data (a.k.a. original data) in the PUs 710(0) to 710(E), the decoding data 720 may be regarded as original decoding data corresponding to the original data. In an exemplary embodiment, the original data in the PUs 710(0) to 710(E) may be considered as being protected by the decoding data 720. In an exemplary embodiment, the decoding data 720 may also be regarded as a RAID (Redundant Array of Independent Disks) error correcting code. Based on the decoding data 720, the data read from the PUs 710(0) to 710(E) may be decoded so as to correct errors possibly existed in the read data.

In an exemplary embodiment, the data for generating the decoding data 720 may also include redundancy bits corresponding to data bits in the data stored in the PUs 710(0) to 710(E). Taking the data stored in the PU 710(0) for example, the redundancy bits therein are, for example, generated by performing the single-frame encoding for the data bits stored in the PU 710(0).

In an exemplary embodiment, when it is intended to read data (a.k.a. target data) stored in one specific PU, the single-frame decoding corresponding to the target data may be performed in advance. For example, if the single-frame encoding for the target data is performed based on the LDPC code, the single-frame decoding for the target data is also performed based on the LDPC code. If the single-frame decoding corresponding to the target data is failed, the multi-frame decoding corresponding to the target data is then performed (e.g., performed based on the RS code adopted in the encoding).

In an exemplary embodiment, the single-frame decoding and the multi-frame decoding may be performed alternately until it is determined that the decoding is failed or the decoding is successful. Taking FIG. 7 for example, when it is intended to read the target data stored in the PU 710(0), a first single-frame decoding corresponding to the target data to be read from the PU 710(0) is performed to correct the possibly-existed errors. If the first single-frame decoding corresponding to the target data is failed, the decoding data 720 and data stored in the PUs 710(0) to 710(E) for generating the decoding data 720 are read and a first multi-frame decoding corresponding to the target data can be performed. If the first multi-frame decoding corresponding to the target data is failed, a second single-frame decoding corresponding to the target data can be performed according to an execution result (e.g., certain bits in the target data may have been corrected) of the first multi-frame decoding. If the second single-frame decoding is still failed, a second multi-frame decoding corresponding to the target data can be performed. By analogy, after performing at least one single-frame decoding and/or performing at least one multi-frame decoding for the target data, the errors in the target data may be corrected gradually. If all the errors in the target data have been successfully corrected after one specific single-frame decoding or one specific multi-frame decoding, a corresponding iteration decoding may then be stopped. Alternatively, if the number of times that the single-frame decoding and/or the multi-frame decoding is performed for the same target reaches a count threshold, it can be determined that the iteration decoding is failed.

In an exemplary embodiment, after one specific multi-frame decoding corresponding to the target data is completed (yet, the target data may still include errors), at least one single-frame decoding can be performed according to a decoding result of that specific multi-frame decoding. Said single-frame decoding can verify whether a correction of the previous multi-frame decoding for at least one error bit in the target data is correct. If a decoding result of the single-frame decoding reflects that the correction for one specific error bit is correct, the correction for that specific error bit may be retained. Otherwise, if the decoding result of the single-frame decoding reflects that the correction for the specific error bit is incorrect, the correction for the specific error bit may be cancelled so a bit value of the specific error bit can be recovered to its initial value.

Figure 8:
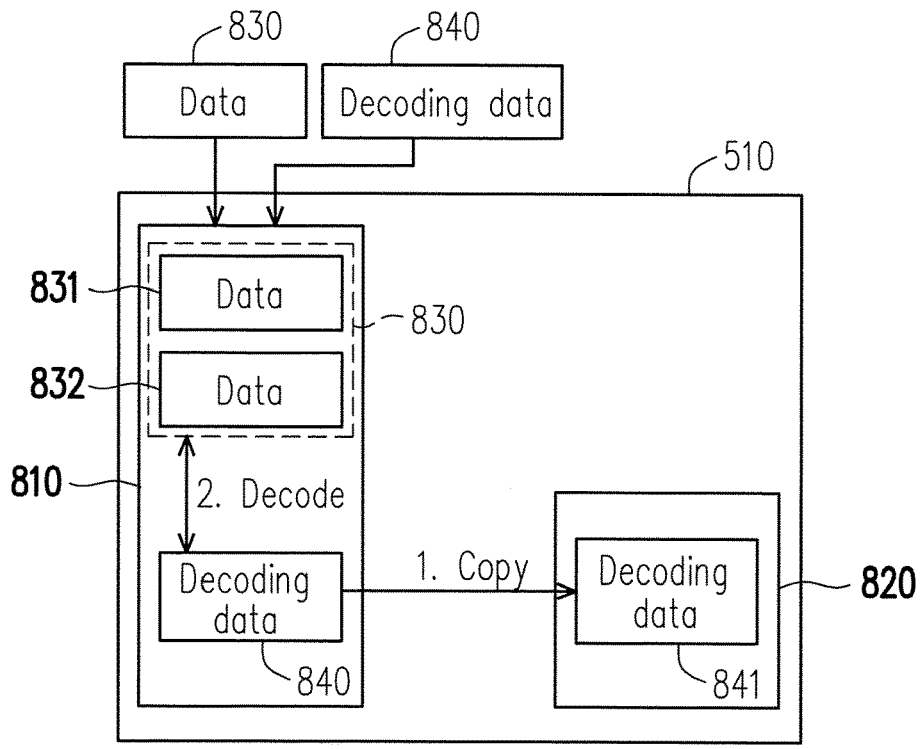
FIG. 8 to FIG. 11 are schematic diagrams illustrating a decoding operation according to an exemplary embodiment of the invention.

FIG. 8 to FIG. 11 are schematic diagrams illustrating a decoding operation according to an exemplary embodiment of the invention. With reference to FIG. 8, the buffer memory 510 includes buffer regions 810 and 820. The buffer region 810 is also known as a first buffer region, and the buffer region 820 is also known as a second buffer region. In an exemplary embodiment, a capacity of the buffer region 810 may be identical or approximately identical to a capacity of the buffer region 820. In an exemplary embodiment, the capacity of the buffer region 820 is less than the capacity of the buffer region 810. In an exemplary embodiment, the buffer regions 810 and 820 may be dynamically configured by the memory management unit 502 of FIG. 5.

When it is determined that a multi-frame decoding corresponding to data 831 needs to be performed, data 830 and decoding data 840 corresponding to the data 830 are then read from the first PU and the second PU, respectively. The data 830 includes data 831 and 832. The data 831 is currently the target data to be decoded and corrected based on the decoding data 840, and the data 832 is the rest of data for generating the decoding data 840. Taking FIG. 7 for example, if the data 831 is the data stored in the PU 710(0), the data 832 may be at least a part of the data stored in the PUs 710(1) to 710(E).

In an exemplary embodiment, the data 830 may be regarded as the original data, and the decoding data 840 may be regarded as the original decoding data corresponding to the data 830, the data 831 and/or the data 832. The data 830 and the decoding data 840 are loaded into the buffer memory 510. For example, the data 830 and the decoding data 840 are temporarily stored into the buffer region 810. It is noted that, before the data 830 is decoded based on the decoding data 840, the decoding data 840 is copied to the buffer region 820 as decoding data 841. After the decoding data 840 is copied to the buffer region 820, the data 830 may be decoded in the buffer region 810 based on the decoding data 840.

In an exemplary embodiment, because a capacity of the buffer memory 510 (or the buffer region 810) is insufficient for storing the entire data 830 all at once (i.e., a total data amount of the data 830 is greater than the capacity of the buffer memory 510 or the buffer region 810), the data 830 may be stored into the buffer region 810 in batches and decoded based on the decoding data 840 in batches. It is noted that, in an exemplary embodiment, during the process of decoding the data 830 in batches, the data 831 is maintained and/or retained continuously in the buffer region 810 until the data 831 is successfully decoded and/or corrected.

In an exemplary embodiment, in correspondence to the decoding performed in the buffer region 810, at least a part of bits in the decoding data 840 may be updated, such that the updated decoding data 840 in the buffer region 810 may be different from the decoding data 841 pre-stored in the buffer region 820. In an exemplary embodiment, in correspondence to the decoding performed in the buffer region 810, the decoding data 840 is updated to be syndrome data. The syndrome data may reflect a decoding state or a decoding result of the decoding performed for the data 830.

Figure 9:
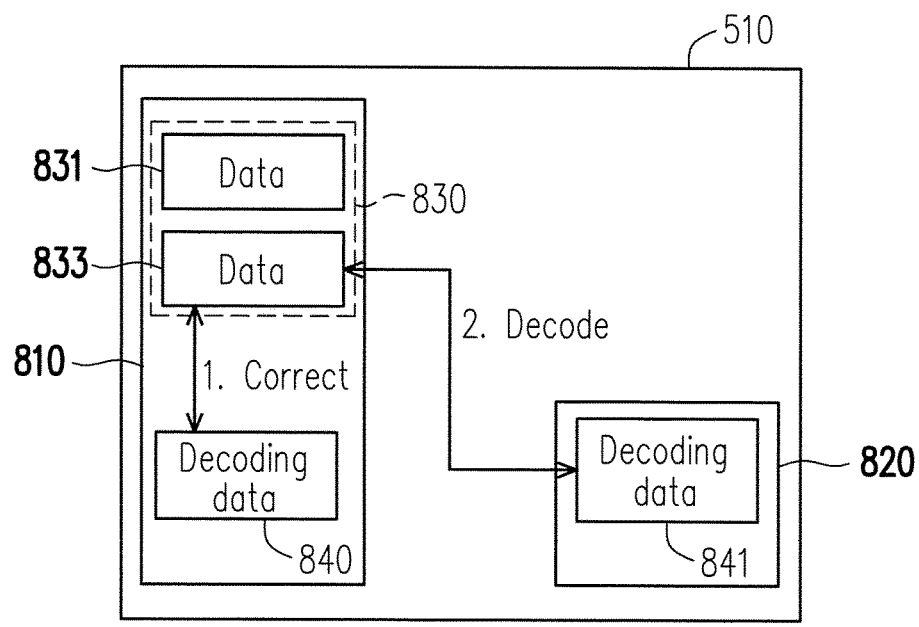

With reference to FIG. 9, it is assumed that data 833 in the data 830 is corrected according to the decoding performed in the buffer region 810, but the data 831 is not yet corrected. In an exemplary embodiment, the data 833 is also known as corrected data. After the data 833 is corrected, the data 833 is decoded based on the decoding data 841 in the buffer region 820. During the process of decoding the data 833 based on the decoding data 841, at least a part of bits in the decoding data 841 may also be updated. The updated decoding data 841 is continuously kept in the buffer region 820. It is noted that, in an exemplary embodiment, the decoding data 841 in the buffer region 820 is only used for decoding the corrected data (i.e., the data 833) in the data 830 and will not be used for decoding data not yet corrected in the data 830. In addition, the updated decoding data 841 may be referred to as the syndrome data corresponding to the data 833, which reflects the decoding state or the decoding result of the decoding performed for the data 833.

In an exemplary embodiment, the correction of the data 833 based on the decoding data 840 is verified by a single-frame decoding corresponding to the data 833. For example, in an exemplary embodiment of FIG. 9, after the data 833 is corrected based on the decoding data 840, the single-frame decoding corresponding to the data 833 is then performed. If the decoding result of the single-frame decoding reflects that the correction for the error bit in the data 833 is correct, a correction result of the data 833 may be retained. Otherwise, if the decoding result of the single-frame decoding reflects that the correction for the error bit in the data 833 is incorrect, the correction result of the data 833 may be cancelled so certain corrected bits in the data 833 may be recovered to their original bit value.

In an exemplary embodiment, the decoding operation of FIG. 8 and FIG. 9 may be regarded as the first multi-frame decoding for the data 831. The first multi-frame decoding is performed for correcting the errors in the data 831. For example, the data 831 may be data to be read as instructed by one specific read command from the host system. If the errors in the data 831 are not completely corrected, the first multi-frame decoding is determined as failed.

Figure 10:
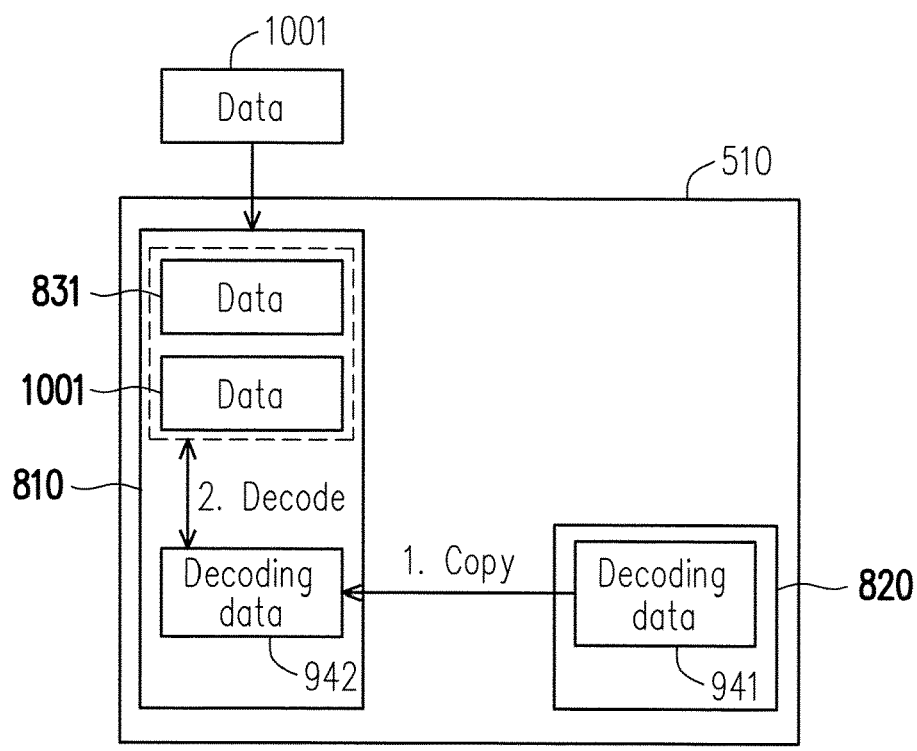

With reference to FIG. 10, if the first multi-frame decoding for the data 831 is failed, data 1001 can be read from the first PU again. It is noted that, continuing to the exemplary embodiments of FIG. 8 and FIG. 9, the data 831 is continuously kept in the buffer region 810, so it is not required to read the data 831 from the first PU again with the data 1001.

In an exemplary embodiment, the data 1001 is also known as first data. The data 1001 may exclude (i.e., not include) the data 833 already corrected in the exemplary embodiment of FIG. 9. The data 1001 is loaded into the buffer memory 510 (e.g., temporarily stored into the buffer region 810).

Before the data 831 and 1001 are decoded, decoding data 941 is copied from the buffer region 820 to the buffer region 810 as decoding data 942. It is noted that, the decoding data 941 is used to represent the updated decoding data 841 in the buffer region 820 of FIG. 9. In other words, a data content of the decoding data 941 is identical to that of the updated decoding data 841 in the buffer region 820 of FIG. 9. After the decoding data 941 is copied from the buffer region 820 to the buffer region 810, the data 831 and 1001 are decoded in the buffer region 810 based on the decoding data 942.

It is noted that, in the exemplary embodiment of FIG. 10, the decoding data 942 for decoding the data 831 and 1001 is copied from the buffer region 820 instead of being read from the second PU. Therefore, the decoding data 942 for decoding the data 831 and 1001 of FIG. 10 is different from the decoding data 840 in FIG. 8 and FIG. 9. In an exemplary embodiment, the decoding data 840 in FIG. 8 and FIG. 9 may also be regarded as original decoding data corresponding to the data 1001. Moreover, because the capacity of the buffer memory 510 or the buffer region 810 is insufficient for storing the entire data 1001 all at once (i.e., a total data amount of the data 1001 is greater than the capacity of the buffer memory 510 or the buffer region 810), the data 1001 may also be stored into the buffer region 810 in batches and decoded based on the decoding data 942 in batches. Further, the data 1001 being stored into the buffer region 810 in batches for decoding does not overwrite the data 831.

Figure 11:
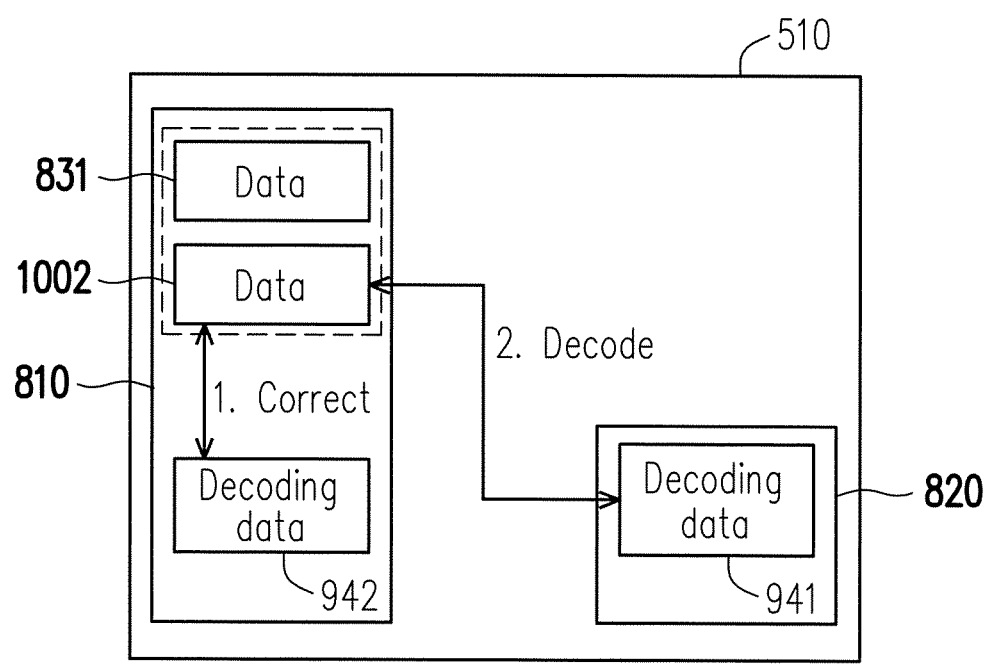

With reference to FIG. 11, it is assumed that data 1002 is corrected according to the decoding performed in the buffer region 810 of FIG. 10, but the data 831 is still not yet corrected. In an exemplary embodiment, the data 1002 is also known as the corrected data. In an exemplary embodiment, a correction for the data 1002 is also verified by the single-frame decoding corresponding to the data 1002 so as to determine the correctness of the correction for the data 1002. After the data 1002 is determined as corrected, the data 1002 is then decoded based on the decoding data 941 in the buffer region 820. During the process of decoding the data 1002 based on the decoding data 941, at least a part of bits in the decoding data 941 may also be updated. The updated decoding data 941 is continuously stored in the buffer region 820 for the usage of the next iteration decoding corresponding to the data 831.

As similar to the exemplary embodiment of FIG. 9, in an exemplary embodiment of FIG. 11, the decoding data 941 in the buffer region 820 is only used for decoding the corrected data (i.e., the data 1002) and will not be used for decoding data not yet corrected (e.g., the data not yet corrected in the data 831 or the data 1001 of FIG. 10). The updated decoding data 941 may also be referred to as the syndrome data corresponding to the data 1002, which reflects the decoding state or the decoding result of the decoding performed for the data 1002. At this point, it can be considered that the second multi-frame decoding for the data 831 is completed. The second multi-frame decoding is also performed for correcting the errors in the data 831. In an exemplary embodiment of FIG. 11, if the errors in the data 831 are not completely corrected, the second multi-frame decoding is also determined as failed.

If the second multi-frame decoding is still failed, the operation of reading the first data excluding the target data and the corrected data, the operation of copying the decoding data from the second buffer region to the first buffer region, the operation of performing the decoding and the data correction in the first buffer region, the operation of performing the decoding for the corrected data based on the decoding data in the second buffer region, and the operation of updating the decoding data in the second buffer region as illustrated in the exemplary embodiments of FIG. 10 and FIG. 11 may all or at least a part be repeatedly performed until the errors in the target data stored in the first buffer region are successfully corrected. In addition, the decoding operation of FIG. 8 to FIG. 11 may be performed by the ECCC 508 in cooperation with the MMC 502 of FIG. 5.

In an exemplary embodiment, the decoding performed based on the decoding data copied to the first buffer region (e.g., the decoding data 840 of FIG. 8 and the decoding data 942 in FIG. 10) is also known as a first type decoding operation, and the decoding performed based on the decoding data stored in the second buffer region (e.g., the decoding data 841 of FIG. 9 and the decoding data 941 in FIG. 11) is also known as a second type decoding operation.

In an exemplary embodiment, the data decoded by the first type decoding operation (e.g., the original data and/or the first data) may include a data unit having an uncorrectable (abbr. UNC) error, and the data decoded by the second type decoding operation (e.g., the corrected data) does not include the data unit having the UNC error. Here, the UNC error refers to an error that cannot be corrected by the corresponding single-frame decoding. Taking FIG. 7 for example, it is assumed that one data unit refers to one frame. If the error in one specific data unit stored in the PU 710(0) cannot be successfully corrected by the single-frame decoding corresponding to that specific data unit, the specific data unit may be regarded as the data unit having the UNC error. Alternatively, if the error in one specific data unit stored in the PU 710(1) can be successfully corrected by the single-frame decoding corresponding to that specific data unit, the specific data unit may be regarded as the data unit not having the UNC error.

In an exemplary embodiment, the first type decoding operation includes a normal decoding mode and an erasure mode. According to a total number of the data units having the UNC error in the data to be decoded (e.g., the data 830 in FIG. 8 or the data 831 and 1001 of FIG. 10), the first type decoding operation may be determined to be operated in the normal decoding mode or the erasure mode. In an exemplary embodiment, if the total number of the data units having the UNC error in the data to be decoded is greater than or equal to a predetermined value (e.g., 2, but not limited thereto), the first type decoding operation performed corresponding to the data to be decoded is operated in the normal decoding mode. If the total number of the data units having the UNC in the data to be decoded is less than the predetermined value, the first type decoding operation performed corresponding to the data to be decoded is operated in the erasure mode. In the erasure mode, the first type decoding operation can usually guarantee the completion (or the success) of decoding and correction for the data to be decoded (or the target data).

In the exemplary embodiment of FIG. 9 or FIG. 11, the data to be decoded in the buffer region 810 may include at least one data unit having the UNC error. In correspondence to the first type decoding operation performed for the data to be decoded, one specific data unit having the UNC error in the buffer region 810 may be corrected to the data unit not having the UNC error. The data unit not having the UNC error may be regarded as the corrected data. In the iteration decoding operation successively performed for multiple times, the first data read each time from the first PU and loaded into the buffer region 810 may exclude (i.e., not include) the data unit already being corrected previously and not currently having the UNC error. In this way, in the iteration decoding operation successively performed for multiple times, the number of the data units having the UNC error in the data to be decoded may be gradually reduced so as improve a decoding success rate.

It is noted that, in the foregoing exemplary embodiments of FIG. 8 to FIG. 11, the original decoding data corresponding to the first data (or the original data) is read from the second PU only when the first type decoding operation is performed on the original data for the first time. In the first type decoding operation performed for the second time and after the second time, the decoding data for decoding the first data are all copied from the second buffer region. In addition, in the (decoding) operation of updating the decoding data stored in the second buffer region, because update on the decoding data in the second buffer region can only be affected by the data unit not having the UNC error, the probability that the decoding data in the second buffer region is affected by the error bit (or the UNC error) may be lowered. Therefore, after copying the decoding data from the second buffer region to the first buffer region, the decoding success rate of the first type decoding operation performed in the first buffer region based on the copied decoding data may be improved.

Figure 12:
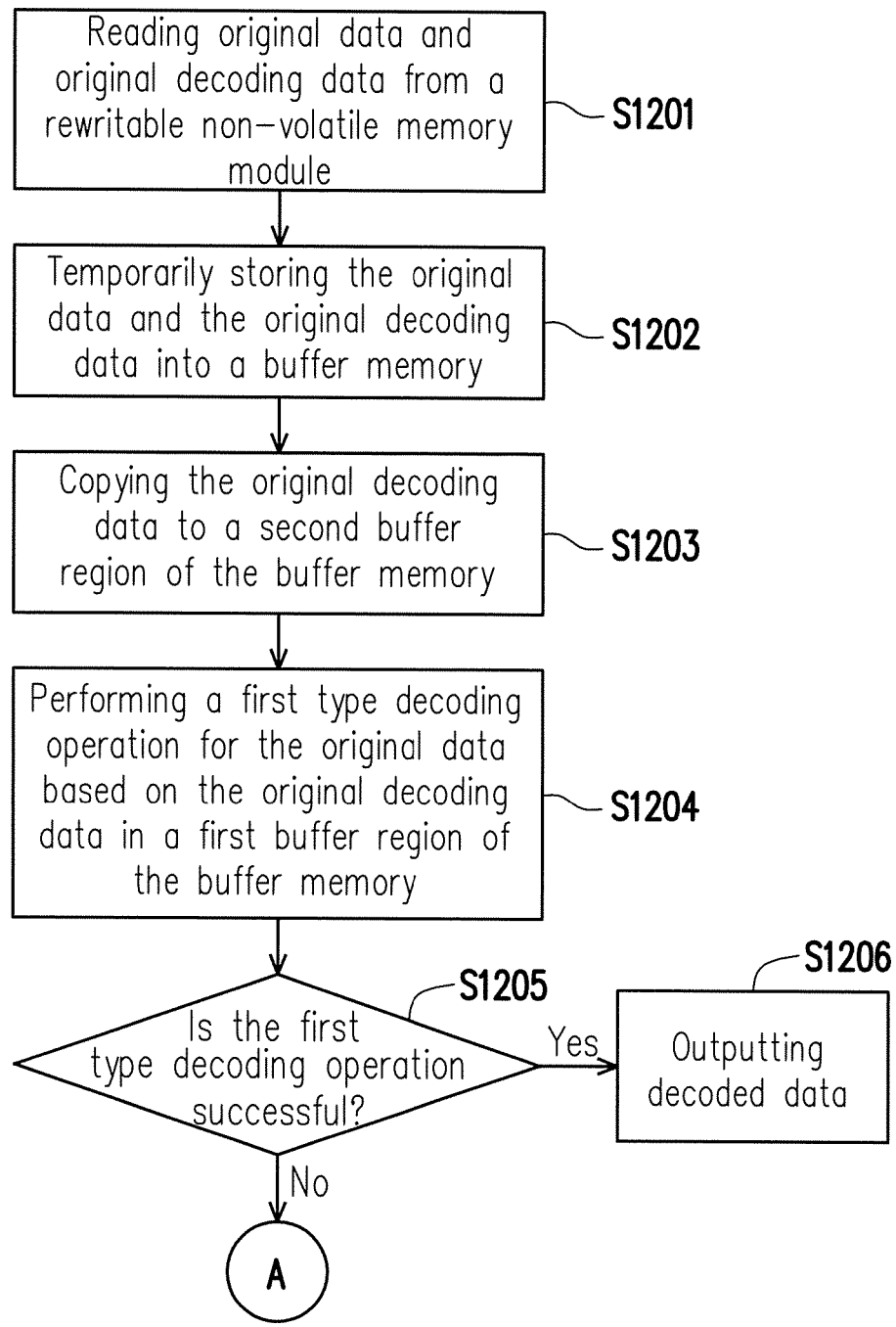
FIG. 12 and FIG. 13 are flowcharts illustrating a decoding method according to an exemplary embodiment of the invention.
Figure 13:
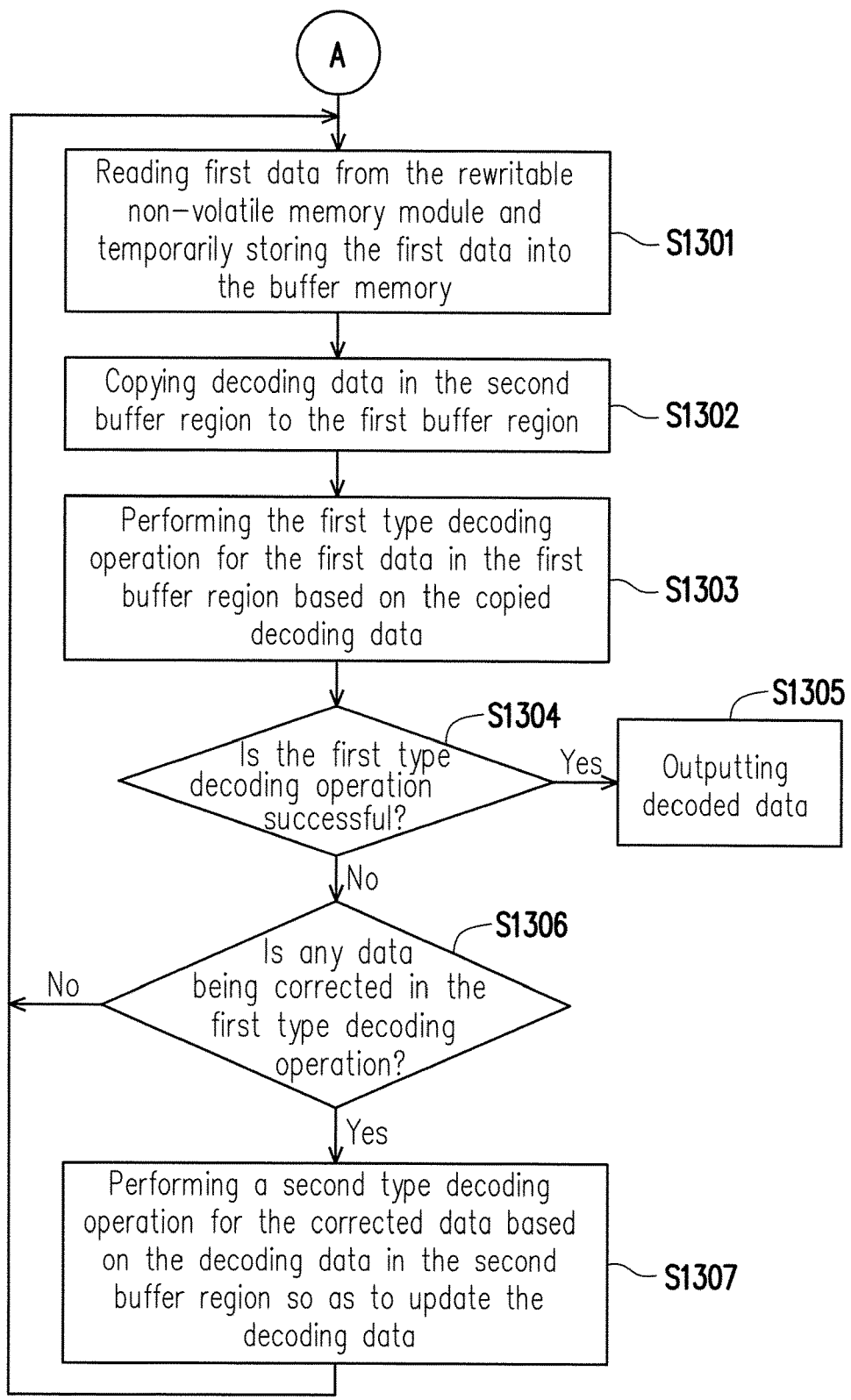

FIG. 12 and FIG. 13 are flowcharts illustrating a decoding method according to an exemplary embodiment of the invention. With reference to FIG. 12, in step S1201, original data and original decoding data corresponding to first data (or the original data) are read from the RNVM module. In step S1202, the original data and the original decoding data are temporarily stored into a first buffer region (e.g., the buffer region 810 of FIG. 8) of a buffer memory (e.g., the buffer memory 510 of FIG. 8). In step S1203, the original decoding data corresponding to the first data is copied to a second buffer region (e.g., the buffer region 820 of FIG. 8) of the buffer memory. In step S1204, a first type decoding operation is performed for the original data based on the original decoding data corresponding to the first data in the first buffer region. In step S1205, whether the first type decoding operation corresponding to the original data is successful is determined. If yes (i.e., the first type decoding operation is successful), in step S1206, successfully decoded data (a.k.a. decoded data) is outputted. If no (i.e., the first type decoding operation is failed), the method proceeds to step S1301 of FIG. 13.

With reference to FIG. 13, in step S1301, the first data is read from the RNVM module and the first data is temporarily stored into the first buffer region of the buffer memory. It is noted that, the first data may not include (i.e., exclude) the target data continuously kept in the first buffer region and the corrected data already corrected in the previous first type decoding operation. In step S1302, decoding data in the second buffer region is copied to the first buffer region. In step S1303, the first type decoding operation is performed for the first data and the target data in the first buffer region based on the copied decoding data. In step S1304, whether the first type decoding operation is successful is determined. If yes, in step S1305, the decoded data is outputted. If no, in step S1306, whether any data (or data unit) is corrected in the first type decoding operation is determined. If no (i.e., no data (or data unit) is corrected in the first type decoding operation), the method returns to step S1301, in which the next iteration decoding is performed again. If yes (i.e., there is data (or data unit) being corrected in the first type decoding operation), in step S1307, a second type decoding operation is performed for the data being corrected (i.e., the corrected data) based on the decoding data in the second buffer region so as to update the decoding data in the second buffer region. The decoding data updated based on the corrected data may be continuously kept in the second buffer region for the usage of the next iteration decoding. After step S1307, step S1301 may be performed repeatedly. Further, in the exemplary embodiments of FIG. 12 and FIG. 13, if a number of execution times of the executed decoding operation reaches a count threshold, the entire decoding operation may be determined as failed and stopped.

In an exemplary embodiment, step S1206 and/or S1305 may further include: copying the successfully decoded data (e.g., the target data) to other physical unit for re-storage, and marking the physical erasing unit originally stored with said data as a damaged physical erasing unit. In addition, more error processing operation may also be performed in step S1206 and/or step S1305, which are not particularly limited by the invention.

Nevertheless, each of steps depicted in FIG. 12 and FIG. 13 have been described in detail as above, thus related description thereof is not repeated hereinafter. It is noted that, the steps depicted in FIG. 12 and FIG. 13 may be implemented as a plurality of program codes or circuits, which are not particularly limited in the invention. Moreover, the methods disclosed in FIG. 12 and FIG. 13 may be implemented with reference to above embodiments, or may be implemented separately, which are not particularly limited in the invention.

In summary, the invention is capable of continuously keeping the decoding data dynamically generated during the decoding process in the buffer memory. Later, when it is required to repeatedly decode the target data, instead of obtaining the decoding data by repeatedly reading the related data from the RNVM module and repeating calculation, the decoding data kept in the buffer memory may be used in real time. Moreover, the invention is also capable of reducing the influence of the UNC error to the decoding data stored in the buffer memory. As a result, the decoding efficiency may be improved with limited capacity of buffer memory.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module, wherein the rewritable non-volatile memory module comprises a plurality of physical units, and the decoding method comprises:

loading first data into a buffer memory, wherein the buffer memory comprises a first buffer region and a second buffer region, each of the first buffer region and the second buffer region occupies a storage capacity of the buffer memory, and the buffer memory is in a memory control circuit unit coupled to the rewritable non-volatile memory module;

copying decoding data in the second buffer region to the first buffer region before the first data is decoded;

performing a first type decoding operation for the first data based on the copied decoding data in the first buffer region, wherein the copied decoding data is different from original decoding data corresponding to the first data, the first data is read from at least one first physical unit among the physical units, the original decoding data corresponding to the first data is read from at least one second physical unit among the physical units, and the decoding data is generated according to the original decoding data; and outputting decoded data if the first type decoding operation is successful.

2. The decoding method according to claim 1, further comprising:

encoding original data to generate the original decoding data corresponding to the first data;

storing the original data into the at least one first physical unit among the physical units; and storing the original decoding data corresponding to the first data into the at least one second physical unit among the physical units.

3. The decoding method according to claim 1, further comprising:

reading original data from the at least one first physical unit among the physical units and reading the original decoding data corresponding to the first data from at least one second physical unit among the physical units;

loading the original data and the original decoding data corresponding to the first data into the buffer memory; and performing the first type decoding operation for the original data based on the original decoding data corresponding to the first data in the first buffer region.

4. The decoding method according to claim 3, further comprising:

before performing the first type decoding operation for the original data based on the original decoding data corresponding to the first data, copying the original decoding data corresponding to the first data to the second buffer region.

5. The decoding method according to claim 1, further comprising:

performing a second type decoding operation for corrected data based on the decoding data in the second buffer region, so as to update the decoding data in the second buffer region, wherein the corrected data is corrected by the first type decoding operation.

6. The decoding method according to claim 5, wherein the corrected data excludes a data unit having an uncorrectable error.

7. The decoding method according to claim 1, wherein the decoding data copied to the first buffer region is generated based on a second type decoding operation performed for corrected data and the original decoding data corresponding to the first data.

8. The decoding method according to claim 1, wherein the first type decoding operation comprises a normal decoding mode and an erasure mode, and the decoding method further comprises:

determining whether to operate the first type decoding operation in the normal decoding mode or the erasure mode according to a total number of a data unit having an uncorrectable error in the first data.

9. The decoding method according to claim 1, wherein the first data is protected by a RAID error correcting code in the at least one first physical unit among the physical units.

10. The decoding method according to claim 1, wherein the first type decoding operation belongs to a multi-frame decoding, and the decoding method further comprises:

performing a single-frame decoding according to a decoding result of the first type decoding operation, so as to verify a correction of the first type decoding operation for at least one error bit.

11. A memory storage device, comprising:

a connection interface unit, configured to couple to a host system;

a rewritable non-volatile memory module, wherein the rewritable non-volatile memory module comprises a plurality of physical units; and a memory control circuit unit, coupled to the connection interface unit and the rewritable non-volatile memory module, wherein the memory control circuit unit is configured to load first data into a buffer memory, wherein the buffer memory comprises a first buffer region and a second buffer region, each of the first buffer region and the second buffer region occupies a storage capacity of the buffer memory, and the buffer memory is in the memory control circuit unit, wherein the memory control circuit unit is further configured to copy decoding data in the second buffer region to the first buffer region before the first data is decoded, wherein the memory control circuit unit is further configured to perform a first type decoding operation for the first data based on the copied decoding data in the first buffer region, wherein the copied decoding data is different from original decoding data corresponding to the first data, the first data is read from at least one first physical unit among the physical units, the original decoding data corresponding to the first data is read from at least one second physical unit among the physical units, and the decoding data is generated according to the original decoding data, wherein the memory control circuit unit is further configured to output decoded data if the first type decoding operation is successful.

12. The memory storage device according to claim 11, wherein the memory control circuit unit is further configured to encode original data to generate the original decoding data corresponding to the first data, wherein the memory control circuit unit is further configured to store the original data into the at least one first physical unit among the physical units, wherein the memory control circuit unit is further configured to store the original decoding data corresponding to the first data into the at least one second physical unit among the physical units.

13. The memory storage device according to claim 11, wherein the memory control circuit unit is further configured to give an instruction for reading original data from the at least one first physical unit among the physical units and reading the original decoding data corresponding to the first data from at least one second physical unit among the physical units, wherein the memory control circuit unit is further configured to load the original data and the original decoding data corresponding to the first data into the buffer memory, wherein the memory control circuit unit is further configured to perform the first type decoding operation for the original data based on the original decoding data corresponding to the first data in the first buffer region.

14. The memory storage device according to claim 13, wherein the memory control circuit unit is further configured to copy the original decoding data corresponding to the first data to the second buffer region before performing the first type decoding operation for the original data based on the original decoding data corresponding to the first data.

15. The memory storage device according to claim 11, wherein the memory control circuit unit is further configured to perform a second type decoding operation for corrected data based on the decoding data in the second buffer region, so as to update the decoding data in the second buffer region, wherein the corrected data is corrected by the first type decoding operation.

16. The memory storage device according to claim 15, wherein the corrected data excludes a data unit having an uncorrectable error.

17. The memory storage device according to claim 11, wherein the decoding data copied to the first buffer region is generated based on a second type decoding operation performed for corrected data and the original decoding data corresponding to the first data.

18. The memory storage device according to claim 11, wherein the first type decoding operation comprises a normal decoding mode and an erasure mode, and the memory control circuit unit is further configured to determine whether to operate the first type decoding operation in the normal decoding mode or the erasure mode according to a total number of a data unit having an uncorrectable error in the first data.

19. The memory storage device according to claim 11, wherein the first data is protected by a RAID error correcting code in the at least one first physical unit among the physical units.

20. The memory storage device according to claim 11, wherein the first type decoding operation belongs to a multi-frame decoding, and the memory control circuit unit is further configured to perform a single-frame decoding according to a decoding result of the first type decoding operation, so as to verify a correction of the first type decoding operation for at least one error bit.

21. A memory control circuit unit for controlling a rewritable non-volatile memory module, wherein the rewritable non-volatile memory module comprises a plurality of physical units, wherein the memory control circuit unit comprises:
a host interface, configured to couple to a host system,
a memory interface, configured to couple to the rewritable non-volatile memory module;
a buffer memory;
an error checking and correcting circuit; and
a memory management circuit, coupled to the host interface, the memory interface, the buffer memory and the error checking and correcting circuit,
wherein the memory management circuit is configured to load first data into the buffer memory, wherein the buffer memory comprises a first buffer region and a second buffer region, and each of the first buffer region and the second buffer region occupies a storage capacity of the buffer memory,
wherein the memory management circuit is further configured to copy decoding data in the second buffer region to the first buffer region before the first data is decoded,
wherein the error checking and correcting circuit is configured to perform a first type decoding operation for the first data based on the copied decoding data in the first buffer region, wherein the copied decoding data is different from original decoding data corresponding to the first data, the first data is read from at least one first physical unit among the physical units, the original decoding data corresponding to the first data is read from at least one second physical unit among the physical units, and the decoding data is generated according to the original decoding data,
wherein the memory management circuit is further configured to output decoded data if the first type decoding operation is successful.

22. The memory control circuit unit according to claim 21, wherein the error checking and correcting circuit is further configured to encode original data to generate the original decoding data corresponding to the first data,
wherein the memory management circuit is further configured to store the original data into the at least one first physical unit among the physical units,
wherein the memory management circuit is further configured to store the original decoding data corresponding to the first data into the at least one second physical unit among the physical units.

23. The memory control circuit unit according to claim 21, wherein the memory management circuit is further configured to give an instruction for reading original data from the at least one first physical unit among the physical units and reading the original decoding data corresponding to the first data from at least one second physical unit among the physical units,
wherein the memory management circuit is further configured to load the original data and the original decoding data corresponding to the first data into the buffer memory,
wherein the error checking and correcting circuit is further configured to perform the first type decoding operation for the original data based on the original decoding data corresponding to the first data in the first buffer region.

24. The memory control circuit unit according to claim 23, wherein the memory management circuit is further configured to copy the original decoding data corresponding to the first data to the second buffer region before performing the first type decoding operation for the original data based on the original decoding data corresponding to the first data.

25. The memory control circuit unit according to claim 21, wherein the error checking and correcting circuit is further configured to perform a second type decoding operation for corrected data based on the decoding data in the second buffer region, so as to update the decoding data in the second buffer region,
wherein the corrected data is corrected by the first type decoding operation.

26. The memory control circuit unit according to claim 25, wherein the corrected data excludes a data unit having an uncorrectable error.

27. The memory control circuit unit according to claim 21, wherein the decoding data copied to the first buffer region is generated based on a second type decoding operation performed for corrected data and the original decoding data corresponding to the first data.

28. The memory control circuit unit according to claim 21, wherein the first type decoding operation comprises a normal decoding mode and an erasure mode, and the memory management circuit is further configured to determine whether to operate the first type decoding operation in the normal decoding mode or the erasure mode according to a total number of a data unit having an uncorrectable error in the first data.

29. The memory control circuit unit according to claim 21, wherein the first data is protected by a RAID error correcting code in the at least one first physical unit among the physical units.

30. The memory control circuit unit according to claim 21, wherein the first type decoding operation belongs to a multi-frame decoding, and the error checking and correcting circuit is further configured to perform a single-frame decoding according to a decoding result of the first type decoding operation, so as to verify a correction of the first type decoding operation for at least one error bit.

* * * * *